United States Patent
Mao et al.

(10) Patent No.: US 12,198,998 B2
(45) Date of Patent: Jan. 14, 2025

(54) DIELECTRIC SIDEWALL PROTECTION AND SEALING FOR SEMICONDUCTOR DEVICES IN A IN WAFER LEVEL PACKAGING PROCESS

(71) Applicant: NXP B.V., Eindhoven (NL)

(72) Inventors: Kuan-Hsiang Mao, Kaohsiung (TW); Che Ming Fang, Kaohsiung (TW); Yufu Liu, Kaohsiung (TW); Wen Hung Huang, Kaohsiung (TW)

(73) Assignee: NXP B.V., Eindhoven (NL)

(*) Notice: Subject to any disclaimer, the term of this patent is extended or adjusted under 35 U.S.C. 154(b) by 197 days.

(21) Appl. No.: 17/546,398

(22) Filed: Dec. 9, 2021

(65) Prior Publication Data

US 2023/0187299 A1   Jun. 15, 2023

(51) Int. Cl.
| H01L 23/31 | (2006.01) |
|---|---|
| H01L 21/78 | (2006.01) |
| H01L 23/00 | (2006.01) |
| H01L 23/498 | (2006.01) |

(52) U.S. Cl.
CPC .......... *H01L 23/3171* (2013.01); *H01L 21/78* (2013.01); *H01L 23/3185* (2013.01); *H01L 23/49816* (2013.01); *H01L 24/05* (2013.01); *H01L 24/11* (2013.01); *H01L 24/13* (2013.01); *H01L 2224/05024* (2013.01); *H01L 2224/1191* (2013.01); *H01L 2224/13022* (2013.01)

(58) Field of Classification Search
CPC .................................................. H01L 23/3171
See application file for complete search history.

(56) References Cited

U.S. PATENT DOCUMENTS

| 5,300,461 A | 4/1994 | Ting |
| 7,923,349 B2* | 4/2011 | McElrea ............ H01L 21/6835 438/106 |
| 9,318,405 B2 | 4/2016 | Xu et al. |
| 9,935,090 B2* | 4/2018 | Yu ............................ H01L 24/96 |
| 11,424,191 B2* | 8/2022 | Chen .................... H01L 23/5383 |
| 2001/0023979 A1 | 9/2001 | Brouvillette et al. |
| 2005/0167799 A1 | 8/2005 | Doan |
| 2010/0072635 A1* | 3/2010 | Kuo ........................ H01L 24/13 257/E23.179 |
| 2014/0239507 A1* | 8/2014 | Hsiao .................... H01L 23/481 438/109 |
| 2017/0200664 A1* | 7/2017 | Tsao ........................ H01L 24/02 |
| 2018/0219000 A1* | 8/2018 | Chang .................... H01L 24/19 |
| 2018/0286827 A1* | 10/2018 | Kimura ................. H01L 21/568 |
| 2019/0027452 A1* | 1/2019 | Ku ........................... H01L 24/11 |
| 2020/0111882 A1* | 4/2020 | Hirabayashi ........ H01L 29/0661 |
| 2023/0013491 A1* | 1/2023 | Tu ........................ H01L 23/3114 |

* cited by examiner

*Primary Examiner* — William A Harriston

(57) ABSTRACT

A method for manufacturing a packaged integrated circuit device includes providing a semiconductor wafer having a plurality of integrated circuit devices. Each integrated circuit device extends into the semiconductor wafer to a first depth. Prior to singulation of the integrated circuit devices on the semiconductor wafer, the method further includes forming a cut between the integrated circuit devices. The cut extends to at least the first depth, but does not extend completely through the semiconductor wafer. The cut exposes a plurality of edges of each of the integrated circuit devices. The method further includes depositing, on each integrated circuit device, a passivation layer on a top surface and on the edges.

19 Claims, 8 Drawing Sheets

Device Fabrication
102

Half-Cut Process
204

200

Die Process Service (DPS)
112

Solder Ball Attach (SBA)
110

Redistribution Layer (RDL) Formation
208

First Passivation
206

DIELECTRIC SIDEWALL PROTECTION AND SEALING FOR SEMICONDUCTOR DEVICES IN A IN WAFER LEVEL PACKAGING PROCESS

FIELD OF THE DISCLOSURE

This disclosure generally relates to wafer level packaging processes for semiconductor devices, and more particularly relates to providing dielectric sidewall protection and sealing for semiconductor devices in a in wafer level packaging process.

BACKGROUND

Wafer-level packaging (WLP) is an integrated circuit device fabrication technology where the product packaging is performed while the individual integrated circuit devices are still in wafer form. This contrasts with traditional integrated circuit device fabrication where the integrated circuit devices on the wafer are first cut into individual die that are then packaged into the final product. The WLP fabrication process permits the on-site testing of the final integrated circuit devices at the wafer fabrication facility. Thus the WLP fabrication process greatly reduces the supply chain dependencies associated with traditional integrated circuit device fabrication.

In a variant of WLP, called fan-out wafer-level processing (FOWLP), the interconnection layers between the integrated circuit device and the outside connection interfaces form a footprint that is larger than the integrated circuit device, in order to accommodate a larger number of external connections. A benefit of the FOWLP process is that the edges of the integrated circuit devices are provided with protective layers due to the molding process. However, the FOWLP process requires additional process equipment.

It would be advantageous to provide a WLP process that provides a die-scale footprint with adequate protection of the die edges, and that eliminated the need for the additional process equipment associated with the FOWLP process.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The description will focus on specific implementations and embodiments of the teachings. This focus is provided to assist in describing the teachings, and should not be interpreted as a limitation on the scope or applicability of the teachings. Moreover, other teachings can be used in association with the teachings of this application, as needed or desired, without limiting the scope of the teachings herein.

In a particular embodiment, a method for manufacturing a packaged integrated circuit device may include providing a semiconductor wafer having a plurality of integrated circuit devices. Each integrated circuit device may extend into the semiconductor wafer to a first depth. Prior to singulation of the integrated circuit devices on the semiconductor wafer, the method may further include forming a cut between the integrated circuit devices. The cut may extend to at least the first depth, but may not extend completely through the semiconductor wafer. The cut may expose a plurality of edges of each of the integrated circuit devices. The method may further include depositing, on each integrated circuit device, a passivation layer on a top surface and on the edges.

In another embodiment, an integrated circuit device formed on a semiconductor wafer may have a first depth. Prior to singulation of the integrated circuit device from the semiconductor wafer, the integrated circuit device may include a cut between the integrated circuit device and a second integrated circuit device fabricated from the semiconductor wafer, and a first passivation layer. The cut may extend to at least the first depth, but may not extend completely through the semiconductor wafer. The cut may expose a plurality of edges of the integrated circuit device. The first passivation layer may be on on a top surface of the integrated circuit device and on the edges.

In another embodiment, an integrated circuit device may have a first footprint. The integrated circuit device may include a first passivation layer on a top surface of the integrated circuit device and on a plurality of edges of the integrated circuit device. The integrated circuit device may further include a redistribution layer formed on a top surface of the first passivation layer. The redistribution layer may have a second footprint that is substantially equal to the first footprint. The integrated circuit device may further include a second passivation formed on the redistribution layer and solder balls attached to the redistribution layer.

Figure 1:
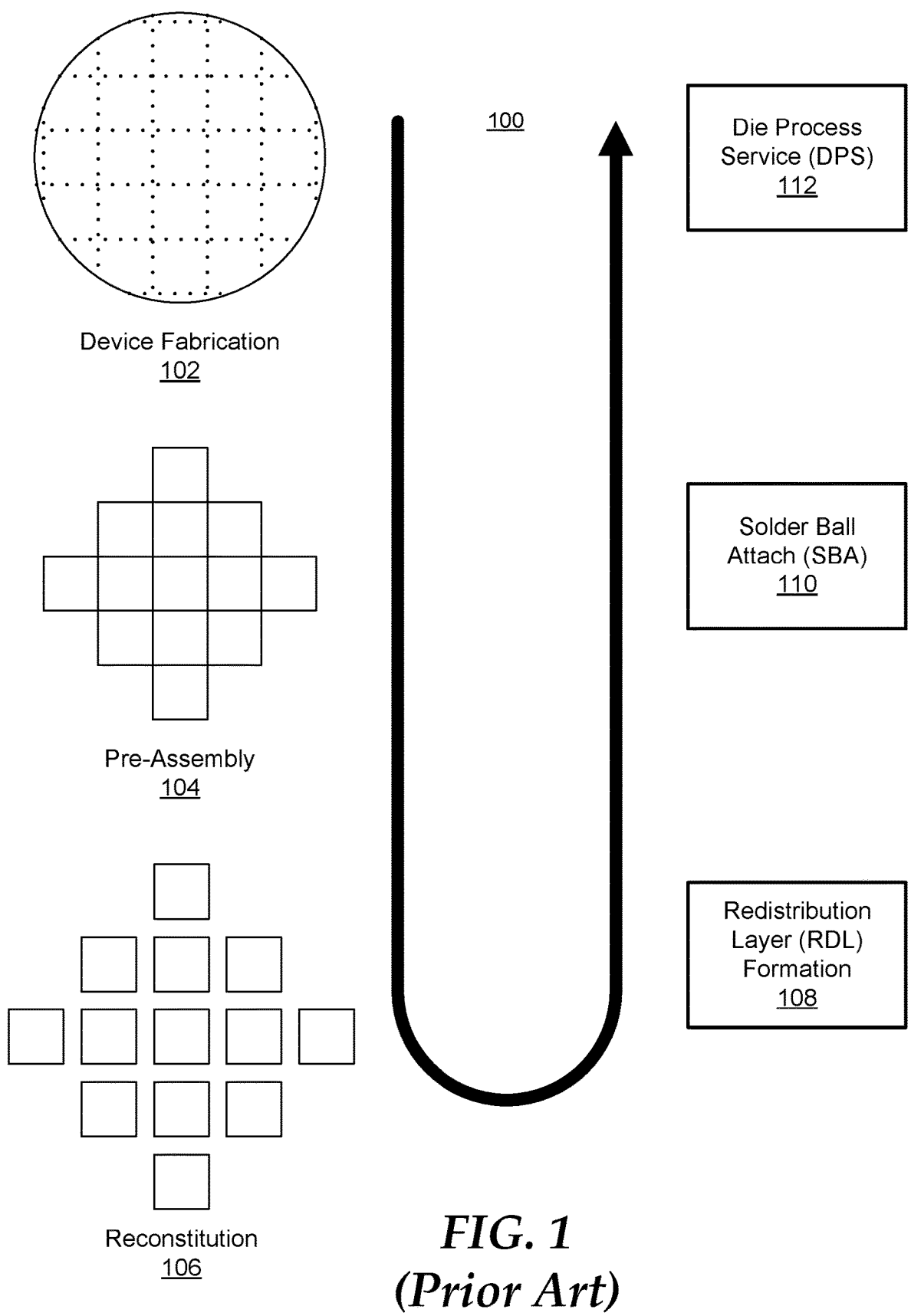
FIG. 1 illustrates a fan-out wafer level packaging (FOWLP) process in accordance with the prior art.

FIG. 1 illustrates a FOWLP process 100 according to the prior art. Process 100 includes device fabrication 102, pre-assembly processing 104, reconstitution 106, redistribution layer (RDL) formation 108, solder ball attach (SBA) 110, and die process services (DPS) 112. Device fabrication 102 represents the process steps typically associated with the fabrication of integrated circuit devices, such as wafer preparation, photolithographic patterning, material deposition such as chemical deposition, vapor deposition, sputter, or the like, annealing, dopant implantation, passivation growth, and the like. Here, the individual integrated circuit devices are shown with dotted lines on the wafer. The particular details of device fabrication 102 will depend upon the nature of the devices to be fabricated, the design of the devices, the processes implemented by the integrated circuit device manufacturer or fabrication facility, or the like. As such, the teachings of the current disclosure are not limited to a particular device fabrication technology, a particular semiconductor material, or other processes, materials, or features of the device fabrication process utilized to fabricate the integrated circuit devices as described herein. Moreover, the details of device fabrication technologies, semiconductor materials, and processes are known in the art, and will not be further described herein, except as needed to illustrate the current embodiments.

Pre-assembly processing 104 represents the range of process performed prior to the completion of device fabrication 102, and may include wafer back-side grinding and die singulation. Here, the individual integrated circuit devices are illustrated as having been singulated by solid lines. In the context of FOWLP process 100, pre-assembly processing 104 may include some level of functional testing, such as a basic functional test to determine if the individual integrated circuit devices exhibit shorts or opens, or more full-function testing, as needed or desired. The integrated circuit devices that exhibit "good" functionality may then be submitted to reconstitution 106, where the individual die are precisely re-positioned on a panel with the additional space needed to accommodate a larger footprint than the individual die, and a carrier is formed. Here, the separated integrated circuit devices are shown as separated and prepared for the formation of the carrier. It will be understood that the carrier formation is typically provided as a molding process that surrounds the edges of the individual integrated circuit devices with the molding compound which may be subject to warpage and cracking in the subsequent process steps that may leave the edges of the integrated circuit devices exposed and unprotected.

RDL formation 108 represents the process steps to form a first passivation layer on the integrated circuit devices on the carrier, to form the interconnection layers between the integrated circuit device and the outside connection interfaces, to form a second passivation layer on the integrated circuit devices, and to form under-bump metallization (UBM) on the outside connection interfaces in preparation for the attachment of the solder balls. In RDL formation 108, the formation of the first passivation layer includes the deposition of a polymer dielectric layer (the passivation layer) on the surface of the carrier, and the patterned etching of the passivation layer to expose the electrical contacts on the surface of the integrated circuit device, such that the subsequently formed interconnect layers are electrically connected to the integrated circuit device. Note here that the first passivation layer is formed only on the surface of the integrated circuit devices, and is prevented from forming on the edges of the integrated circuit devices by the molding compound utilized in forming the carrier. The details of RDL formation are known in the art, and will not be further described herein, except as needed to illustrate the current embodiments.

SBA 110 represents the process steps used to attach solder balls to the UBM regions, thereby forming the integrated circuit device into a package that can be soldered into larger circuits, such as by soldering the integrated circuit device onto a printed circuit board (PCB), or otherwise integrated into a final product, as needed or desired. Finally, DPS 112 represents the process steps used to finalize the integrated circuit device package for shipment to the end user, and may include carrier taping, integrated circuit device re-singulation from the carrier, tape removal, laser marking, and packaging of the packaged integrated circuit devices for shipment to the end users.

Figure 2:
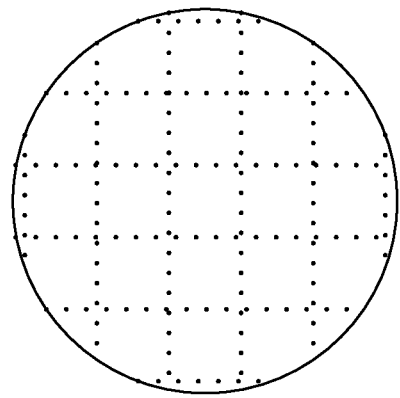
FIG. 2 illustrate a wafer level packaging (WLP) process in accordance with an embodiment of the current disclosure.
Figure 2:
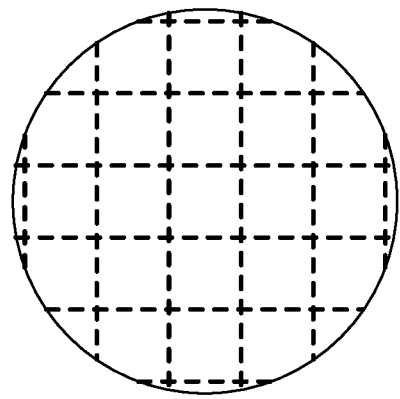
Figure 2:
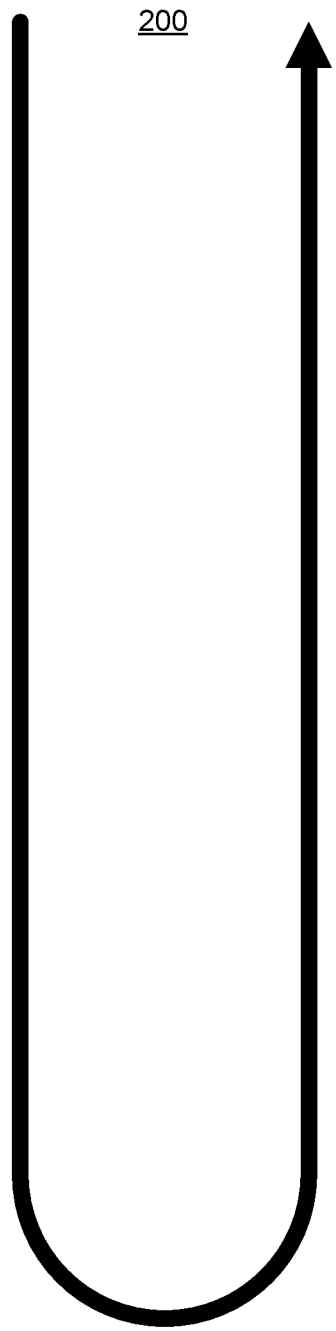

FIG. 2 illustrates a WLP process 200 that eliminates the need for the pre-assembly and reconstitution processes as utilized in FOWLP process 100, and further provides passivation protection of the edges of the integrated circuit devices that are produced thereby. Process 200 includes device fabrication 102, a half-cut process 204, a first passivation process 206, a reconstitution 208, RDL formation 108, SBA 110, and DPS 112. Device fabrication 102, may be understood to represent the same process steps in FIG. 1 and in FIG. 2, in that the integrated circuit devices produced by both FOWLP process 100 and WLP process 200 will each produce functionally similar integrated circuit devices. Further, with the exception of the footprint of the final packaged integrated circuit devices, SBA 110, and DPS 112 may be understood to represent the same process steps in FIG. 1 and in FIG. 2. As such, the description of device fabrication 102, SBA 110, and DPS 112 will not be redescribed here, but will incorporate the teachings of the prior art FOWLP process 100, as described above.

Half-cut process 204 represents the process steps related to providing a partial cut between the integrated circuit devices that does not result in the singulation of the integrated circuit devices. In this way, the wafer operates as the carrier for the integrated circuit devices, and no additional process steps for reconstitution are needed. Moreover, because the wafer operates as the carrier, backside grinding is not performed at this stage. In this way, the wafer retains the structural integrity needed to perform the subsequent process steps. It will be understood that the integrated circuit devices, as formed on the wafer by device fabrication 102 only extend a partial depth into the wafer, and that the remaining depth of the wafer consists of a relatively homogeneous bulk semiconductor material. Here, while half-cut process 204 implies that the cutting process extends half way through the wafer, the term "half-cut" should not necessarily be construed literally, and the depth of the half-cut process may be understood to extend to the depth associated with the integrated circuit devices, and may be a depth greater than or less than half the wafer thickness, as needed or desired.

Half-cut process 204 may be performed by any suitable singulation process that is amenable to the partial cutting of the wafer. For example, half-cut process 204 may be performed by a saw blade dicing process, a laser dicing process, a plasma dicing process, or the like. It will be understood that, where half-cut process 204 is performed by a saw blade dicing process, the depth of the saw lane may be adjusted on the saw blade dicing equipment as needed or desired. Further, where half-cut process 204 is performed by a laser dicing process, the depth of the laser cut may be adjusted by one or more of the laser power level, the cut speed, or the like, as needed or desired. Finally, where half-cut process 204 is performed by a plasma dicing process, the depth of plasma etching may be adjusted by one or more of the number of plasma etch steps, the duration of the plasma etch steps, or the like. It will be further understood that, where half-cut process 204 is performed by a plasma dicing process, the processing of the integrated circuit devices may be performed within the context of, and as an extension of device fabrication 102, in that the processing equipment utilized in the device fabrication may also be utilized in the half-cut process. As such, the use of plasma dicing processes may result in less handling of the integrated circuit devices and a shrinking of the supply chain processes needed to fabricate the packaged integrated circuit devices. The details of wafer cutting are known in the art, and will not be further described herein except as needed to illustrate the current embodiments. In any case, half-cut process 204 will be understood to expose the edges of the individual integrated circuit devices, while retaining the wafer as the carrier for further WLP processes.

First passivation process 206 represents a first process step in RDL formation 208 to form a first passivation layer on the integrated circuit devices on the wafer. However, here, in contrast to RDL formation 108, the formation of the first passivation layer includes the deposition of the polymer dielectric layer (the passivation layer) not only on the surface of the integrated circuit device, but also the edges of the integrated circuit devices by virtue of the exposure of the edges by half-cut process 204. The subsequent patterned etching of the passivation layer to expose the electrical contacts on the surface of the integrated circuit device, and the formation of the interconnect layers are performed in RDL formation 208. As noted above, SBA 110 and DPS 112 represent process steps similar to the process steps described above with respect to FIG. 1.

Figure 3:
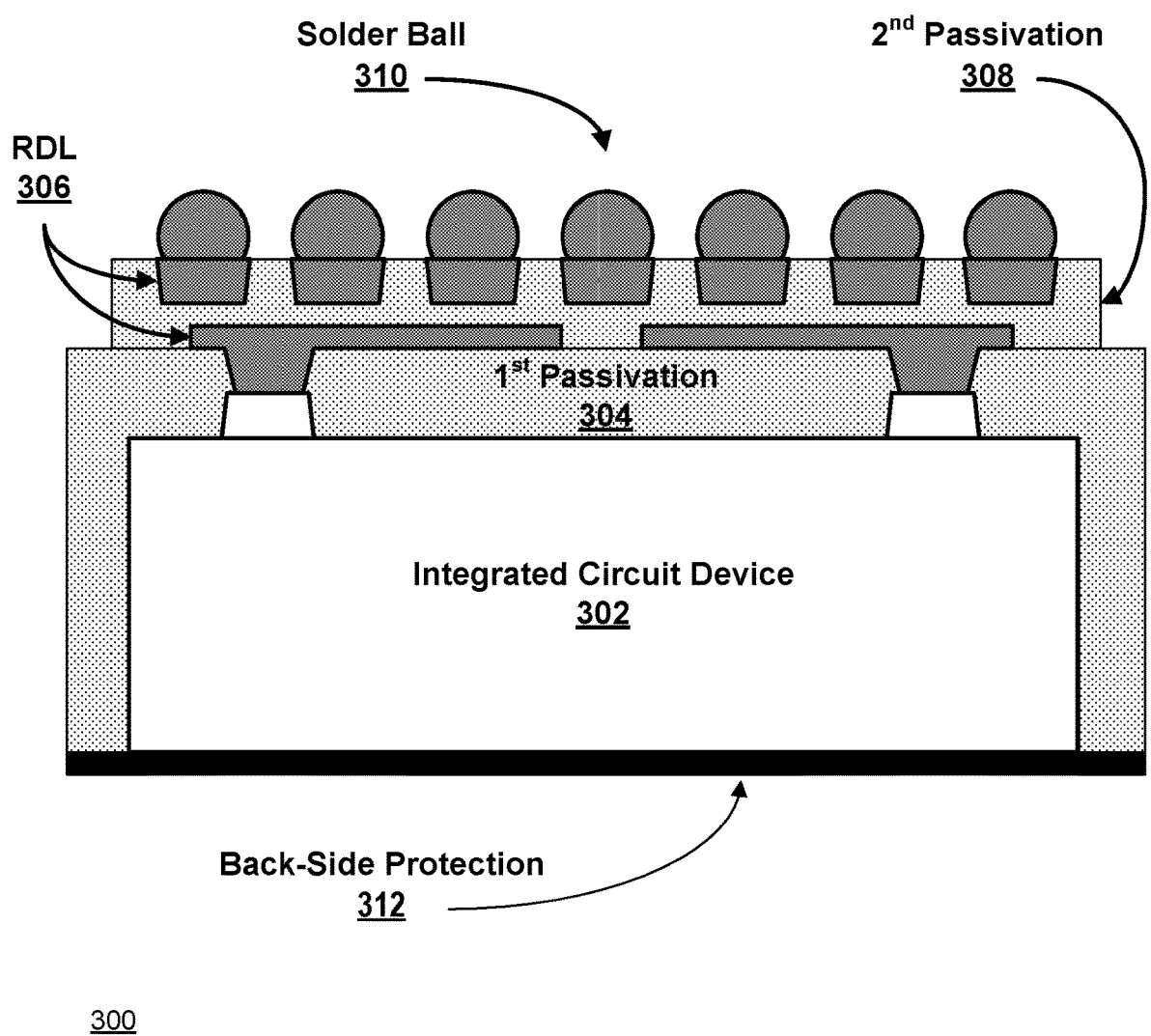
FIG. 3 illustrates a packaged integrated circuit device as may be fabricated utilizing the WLP process of FIG. 2.

FIG. 3 illustrates a packaged device 300 as may be fabricated utilizing process 200. Device 300 includes an integrated circuit device 302, a first passivation layer 304, RDL metallization layers 306, a second passivation layer 308, solder balls 310, and a back-side protection layer 312. Integrated circuit device 302 may be fabricated based upon a device fabrication process similar to device fabrication process 102. A wafer from which integrated circuit device 302 was taken may have been processed by a half-cut process similar to half-cut process 204. First passivation layer 304 may be formed utilizing a first passivation process similar to first passivation process 206. RDL metallization layers 306 and second passivation layer 308 may be formed utilizing a RDL process similar to RDL process 208. Solder balls 310 may be applied utilizing a SBA process similar to SBA process 110. Finally, back-side protection layer 312 may be applied as a step in a DPS process similar to DPS 112.

Figure 4:
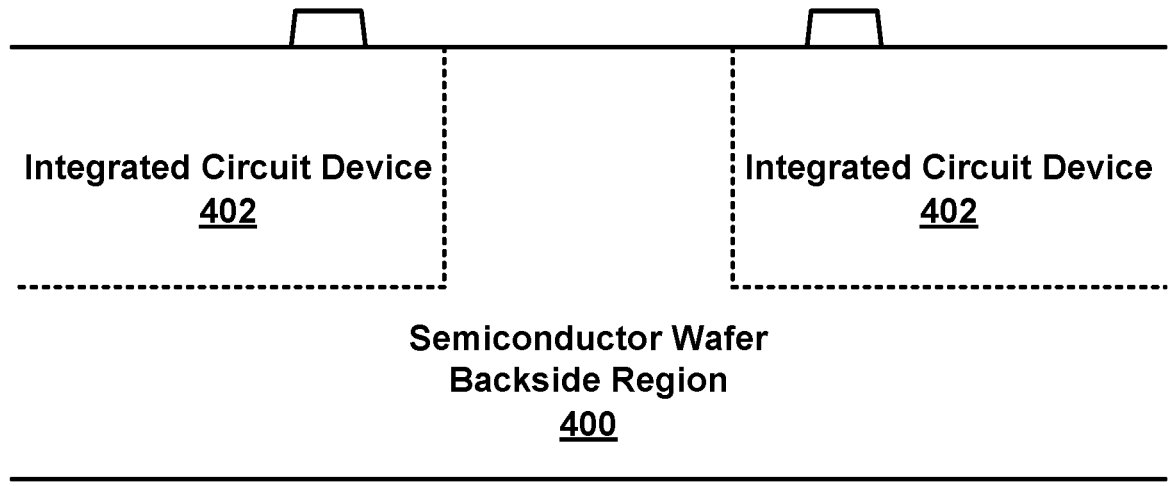
FIGS. 4-9 illustrate select process steps of a WLP process in accordance with an embodiment of the current disclosure.

FIGS. 4-9 illustrate select process steps of a WLP process similar to WLP process 200. FIG. 4 illustrates a semiconductor wafer 400 with integrated circuit devices 402 fabricated into the semiconductor material. Integrated circuit devices 402 may be fabricated based upon a device fabrication process similar to device fabrication process 102. The extend of semiconductor devices 402 is illustrated with dotted lines. Note that integrated circuit devices 402 are separated in semiconductor wafer 400 by a gap of unprocessed semiconductor material of the semiconductor wafer, and that the depth of the integrated circuit devices does not extend to the full depth of the semiconductor wafer.

Figure 5:
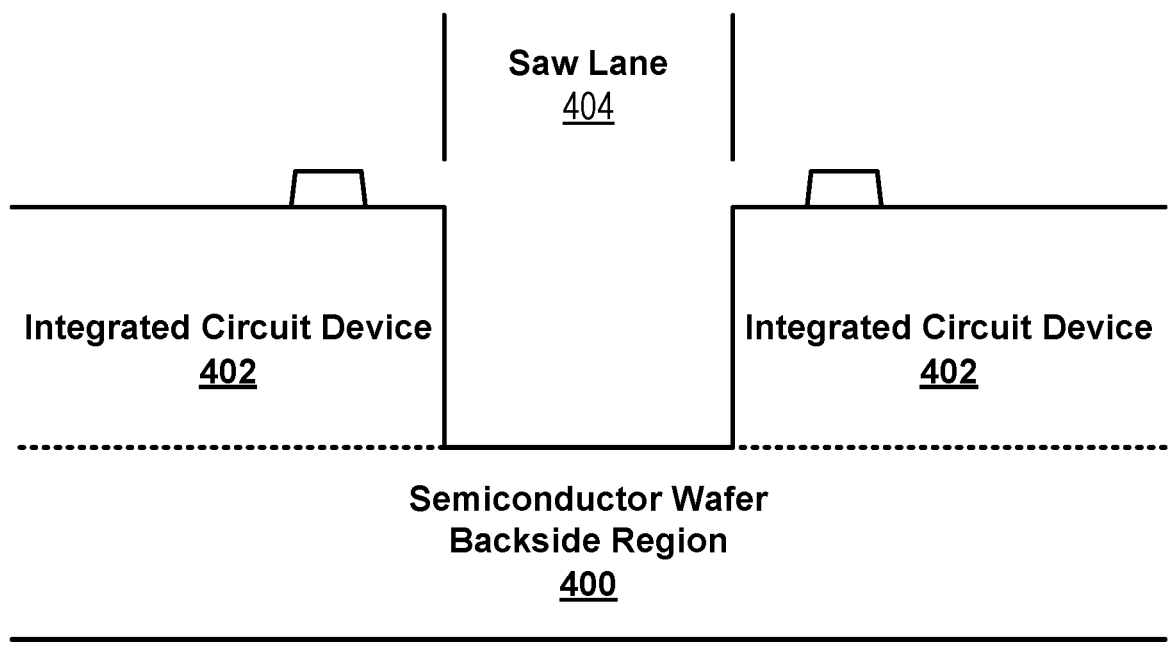

FIG. 5 illustrates semiconductor wafer 400 after having been subjected to process steps similar to half-cut process 204. Here, the semiconductor material of semiconductor wafer 400 that is between integrated circuit devices 402 has been removed by the half-cut process. The width of the gap between integrated circuit devices 402 is shown as a saw lane width 404. It will be understood that saw lane 404 is broadly representative of the gap formed between integrated circuit devices 402 by whatever cutting process is utilized. Thus, where a laser dicing process is utilized, saw lane 404 may be understood to represent a beam width of the laser utilized in the process, and where a plasma dicing process is utilized, saw lane 404 may be understood to represent a patterned width that is etched into semiconductor wafer 400, as needed or desired. Note that, where a plasma dicing process is utilized, it may be possible to form a narrower gap between integrated circuit devices 402 than may be achievable utilizing either a saw-cut dicing process or a laser dicing process, thereby permitting denser placement of the integrated circuit devices on semiconductor wafer 400. In any case, note that the gap between integrated circuit devices 402 is formed to a depth that is at least equal to, if not greater than the depth of the integrated circuit devices in semiconductor wafer 400.

Figure 6:
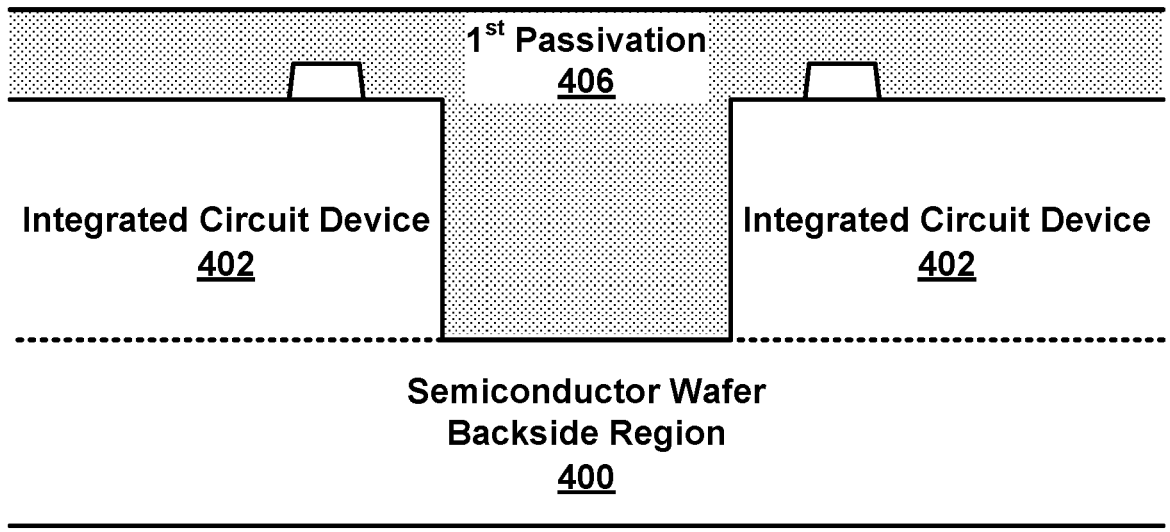

FIG. 6 illustrates semiconductor wafer 400 after a first passivation layer 406 has been formed on the surface of integrated circuit devices 402 and within the trench between the integrated circuit devices. First passivation layer 406 is formed to protect the internal elements of integrated circuit devices 402 and the edges of the integrated circuit devices. An example of a passivation layer formation may include growth of a barrier oxide layer, deposition of an oxide layer and a nitride layer by a chemical vapor deposition process, or by another passivation process as needed or desired.

Figure 7:
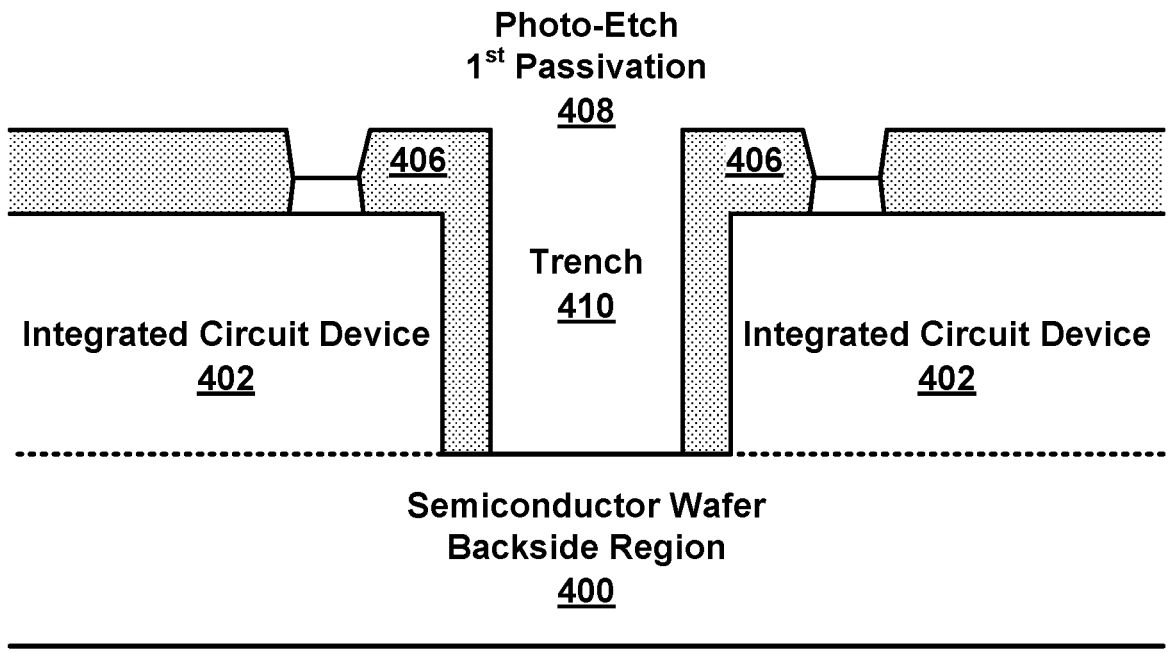

FIG. 7 illustrates semiconductor wafer 400 after a photo-etch process 408. Here, first passivation layer 406 has been etched in the locations of contact pads of integrated circuit devices 402, and in a trench 410 between the integrated circuit devices. The width of trench 410 is less than the width of saw lane 404. Here, by patterning and etching first passivation layer 406 to form trench 410, the width of first passivation layer 406 on the edges of integrated circuit devices 402 can be tightly controlled to any width desired to ensure adequate protection of the edges of the integrated circuit devices.

Figure 8:
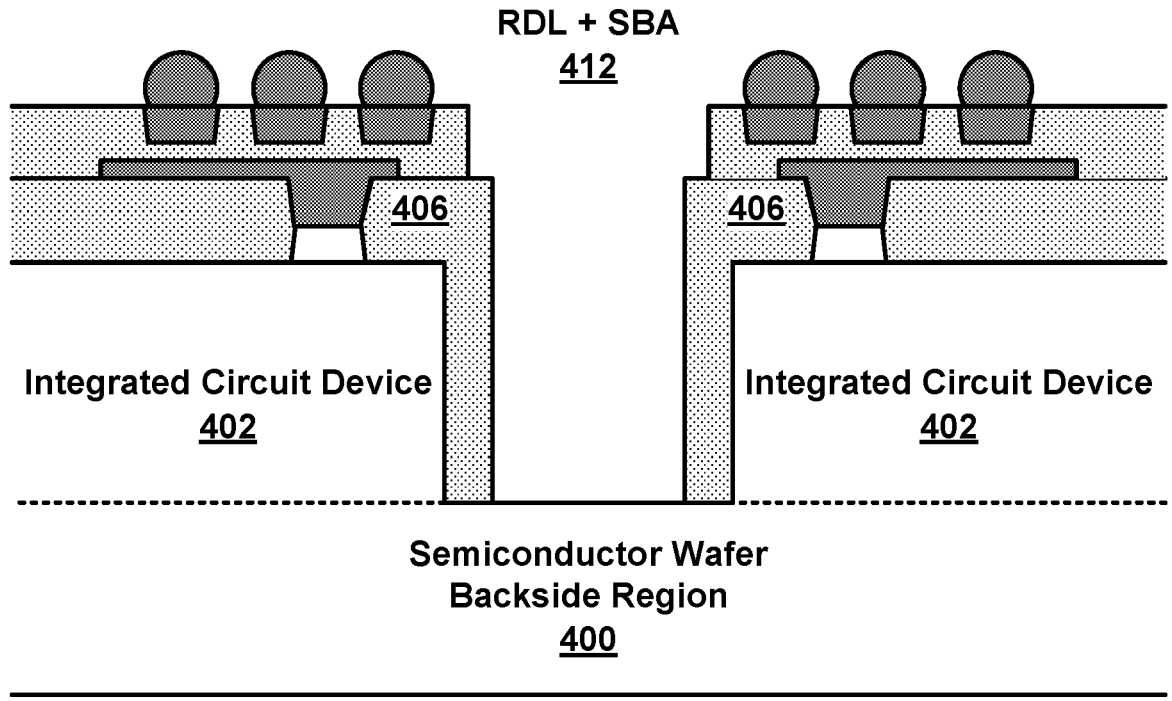

FIG. 8 illustrates semiconductor wafer 400 after a completion of RDL and a SBA processes. Note that at this point in the fabrication process, testing may be performed on the packaged integrated circuit devices as needed or desired. Such testing may include a basic functional test, such as a shorts/opens test, or may include more robust feature testing of the packaged integrated circuit devices, as needed or desired. Also note that in all processing from device fabrication through the processes as described above in FIGS. 4-8, the backside region of semiconductor wafer 400 has remained intact, such that, particularly where the half-cut process is performed by a plasma dicing process, all aspects of the fabrication of the packaged integrated circuit devices may be performed within the confines of a device fabrication facility with no need to move the wafers to other assembly lines for singulation, packaging, and testing.

Figure 9:
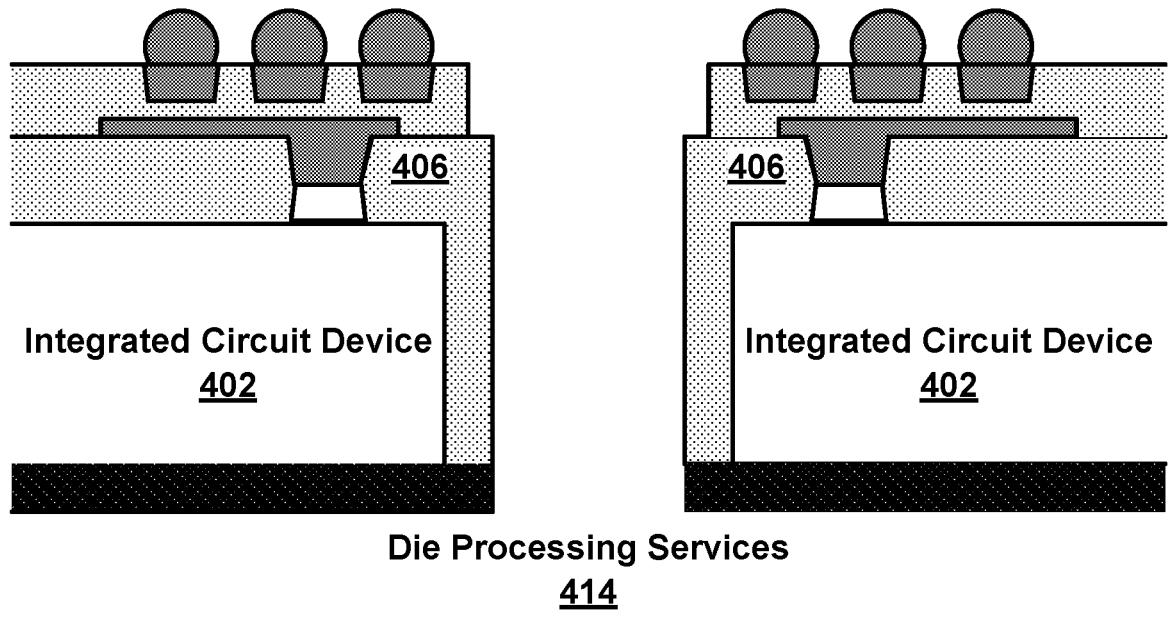

FIG. 9 illustrates the packaged integrated circuit devices formed on semiconductor wafer 400 after the completion of a DPS process. Here the DPS process includes a back-side grinding of semiconductor wafer 400 which results in the singulation of the integrated circuit devices, and may further include the process steps used to finalize the integrated circuit device package for shipment to the end user, such as laser marking, and packaging of the packaged integrated circuit devices for shipment to the end users. As illustrated, the packaged integrated circuit devices include a back-side protective layer that is added in a particular process step of the DPS. The inclusion of the back-side protective layer is optional, and may be include or excluded from the packaged integrated circuit device as needed or desired.

Figure 10:
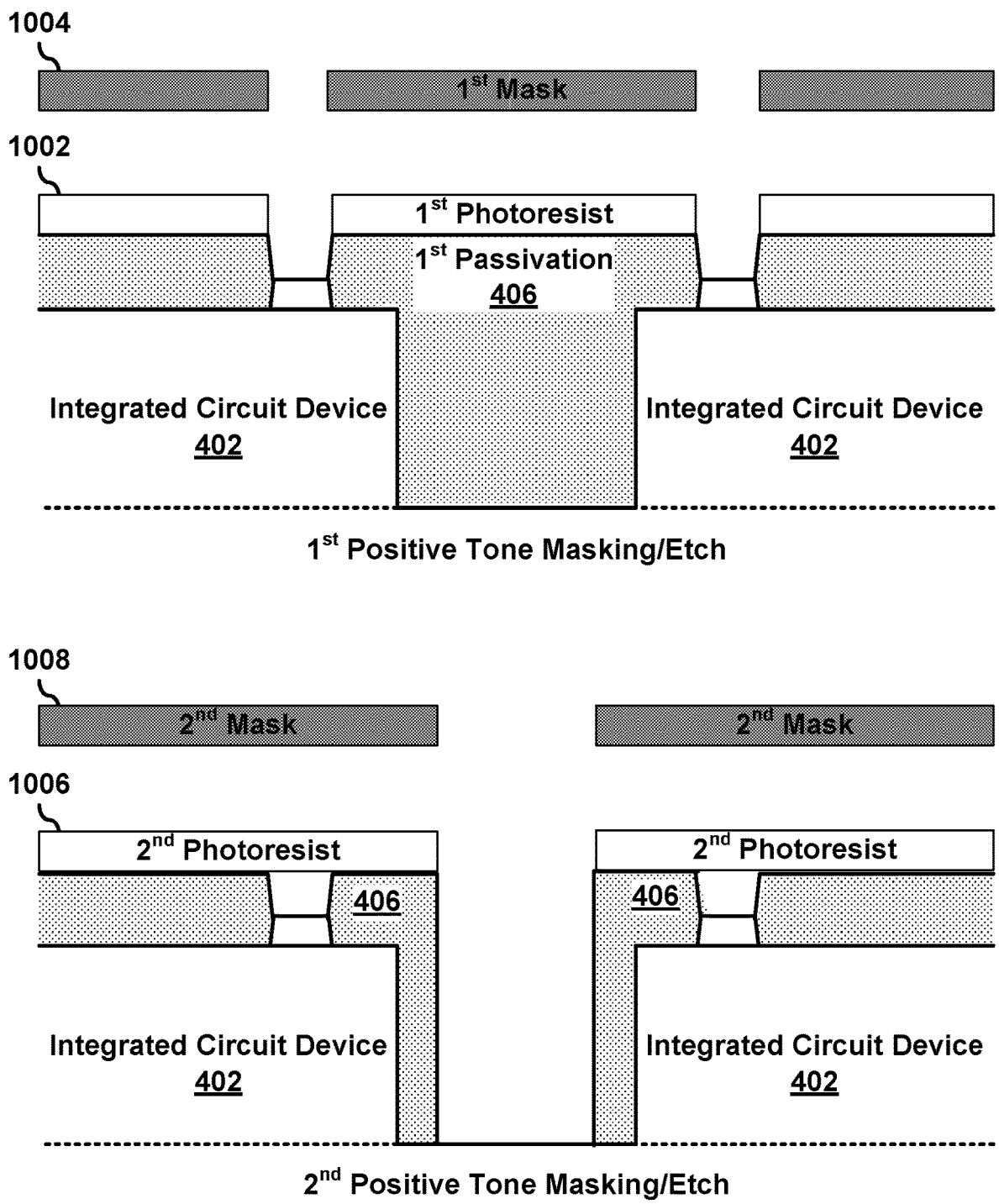
FIGS. 10 and 11 illustrate detailed masking and etching steps of a WLP process in accordance with an embodiment of the current disclosure.
Figure 11:
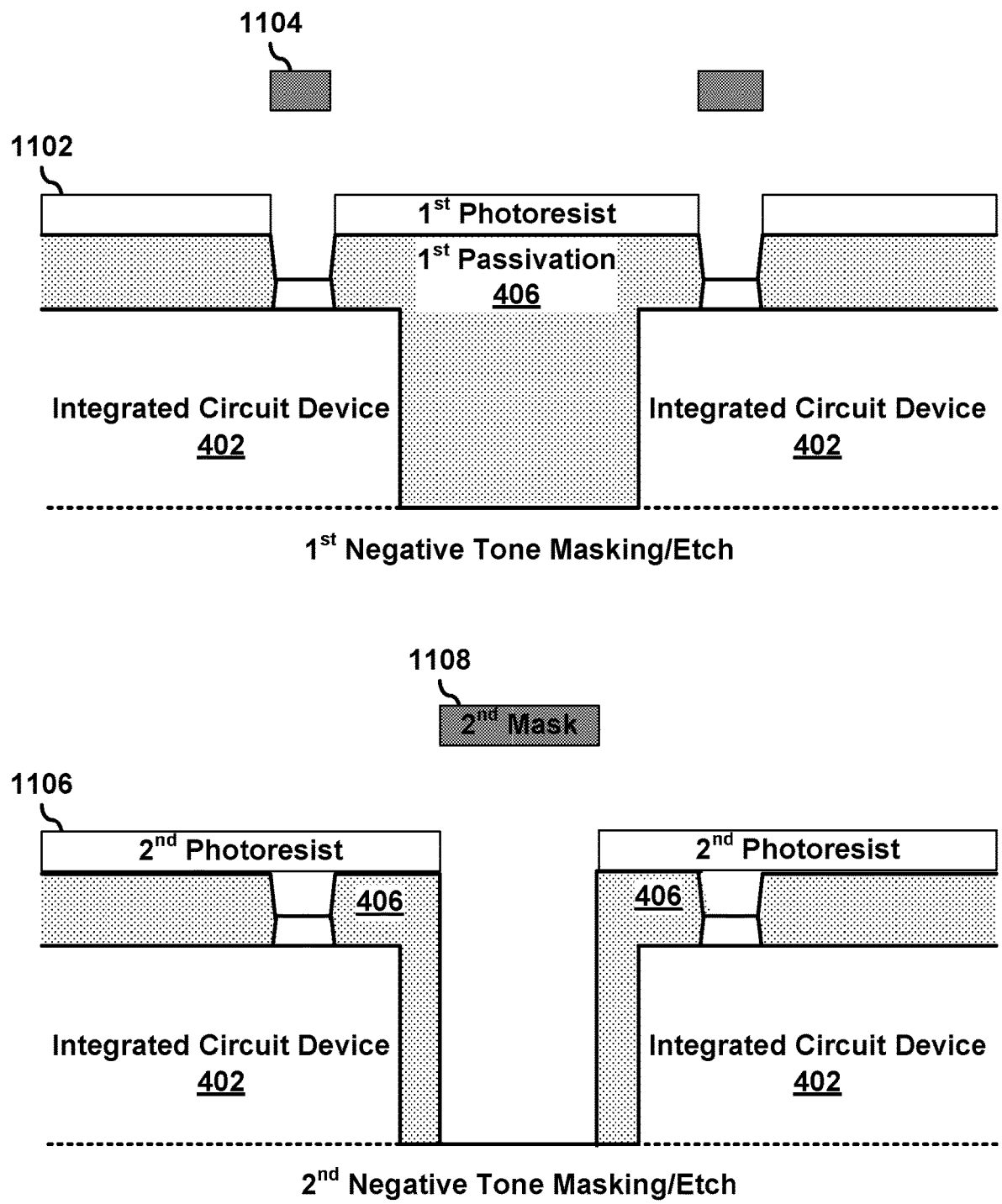

FIGS. 10 and 11 illustrate detailed masking and etching steps that may be utilized in etching of first passivation layer 406 on semiconductor 400 wafer in accordance with various embodiments of the WLP process described in FIG. 7. FIG. 10 illustrates a WLP process 1000 where positive-tone masking is utilized. In positive-tone masking, a photoresist polymer that is applied to the surface of first passivation layer 406 becomes more soluble to a developer when exposed to light. As such a photomask utilized in positive-tone masking permits light to expose the areas of first passivation layer 406 that are to be etched. Here, in the top portion of FIG. 10, a first positive-tone photoresist layer 1002 is applied, for example by a spinning process, to the surface of first passivation layer 406, a first photo-mask 1004 is used to expose the first photoresist layer above the metal contact pads of integrated circuit devices 402, the first photoresist layer is developed, and the regions of the first passivation layer above the metal contact pads are etched to expose the metal contact pads. Then, in the bottom portion of FIG. 10, a second positive-tone photoresist layer 1006 is applied to the surface of first passivation layer 406, a second photomask 1008 is used to expose the first photoresist layer above the trench area between integrated circuit devices 402, the second photoresist layer is developed, and the regions of the first passivation layer above the trench are etched to expose the trench.

FIG. 11 illustrates a WLP process 1100 where negative-tone masking is utilized. In negative-tone masking, a photoresist polymer that is applied to the surface of first passivation layer 406 becomes less soluble to a developer when exposed to light. As such a photomask utilized in negative-tone masking permits light to expose the areas of first passivation layer 406 that are not to be etched. Here, in the top portion of FIG. 11, a first negative-tone photoresist layer 1102 is applied, for example by a spinning process, to the surface of first passivation layer 406, a first photo-mask 1104 is used to expose the first photoresist layer above all but the metal contact pads of integrated circuit devices 402, the first photoresist layer is developed, and the regions of the first passivation layer above the metal contact pads are etched to expose the metal contact pads. Then, in the bottom portion of FIG. 11, a second negative-tone photoresist layer 1106 is applied to the surface of first passivation layer 406, a second photomask 1108 is used to expose the first photoresist layer above all but the trench area between integrated circuit devices 402, the second photoresist layer is developed, and the regions of the first passivation layer above the trench are etched to expose the trench.

Here, it will be understood that FIGS. 10 and 11 illustrate exemplary process flows and are not intended to be limiting it terms of the order of the processes performed. In particular, it may be desirable to etch the trench between integrated circuit devices 402 prior to etching the contact pads, or it may be desirable to expose both the trench and the contact pads in a single process step, as needed or desired. Moreover, it may be desirable to utilize both positive-tone photoresist and negative-tone photoresist in various process steps, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method for forming a packaged integrated circuit device, the method comprising:

providing a semiconductor wafer having a plurality of integrated circuit devices, each integrated circuit device extending into the semiconductor wafer to a first depth; and prior to singulation of the integrated circuit devices on the semiconductor wafer:
forming a cut between the integrated circuit devices, the cut extending to at least the first depth, but the cut not extending completely through the semiconductor wafer, wherein the cut exposes a plurality of edges of each of the integrated circuit devices; and
depositing, on each integrated circuit device, a passivation layer on a top surface and on the edges; and singulating the integrated circuit devices on the semiconductor wafer, wherein singulating the integrated circuit devices includes grinding a back side of the silicon wafer to at least the first depth.

2. The method of claim 1, wherein, prior to singulation of the integrated circuit devices on the semiconductor wafer, the method further comprises:
forming, on the passivation layer on each integrated circuit device, a redistribution layer.

3. The method of claim 2, wherein, prior to singulation of the integrated circuit devices on the semiconductor wafer, the method further comprises:
applying, on each integrated circuit device, solder balls on the redistribution layer.

4. The method of claim 1, further comprising:
etching the passivation layer to form a trench between integrated circuit devices, the trench extending to at least the first depth.

5. The method of claim 4, wherein in etching the passivation layer, the passivation layer remains at a first thickness on the edges of the integrated circuit devices.

6. The method of claim 4, wherein, in etching the passivation layer, the method further comprises:
providing a positive-tone photoresist on a surface of the passivation layer; and
exposing the positive-tone photoresist in a region associated with the trench.

7. The method of claim 4, wherein, in etching the passivation layer, the method further comprises:
providing a negative-tone photoresist on a surface of the passivation layer; and
blocking the negative-tone photoresist from being exposed in a region associated with the trench.

8. The method of claim 1, wherein, in providing the cut between the integrated circuit devices, the cutting comprises:
providing a saw blade dicing process.

9. The method of claim 1, wherein, in providing the cut between the integrated circuit devices, the cutting comprises:
providing a laser dicing process.

10. The method of claim 1, wherein, in providing the cut between the integrated circuit devices, the cutting comprises:
providing a plasma dicing process.

11. The method of claim 1, further comprising:
providing, on a back side of each of the integrated circuit devices, a protective layer.

12. An integrated circuit device formed on a semiconductor wafer, the integrated circuit device having a first depth, wherein, prior to singulation of the integrated circuit device from the semiconductor wafer, the integrated circuit device comprises:

a cut between the integrated circuit device and a second integrated circuit device formed on the semiconductor wafer, the cut extending to at least the first depth, but the cut not extending completely through the semiconductor wafer, wherein the cut exposes a plurality of edges of the integrated circuit device; and a first passivation layer on a top surface of the integrated circuit device and on the edges;

wherein, in singulating the integrated circuit device from the semiconductor wafer, a back side of the silicon wafer is ground to the first depth.

13. The integrated circuit device of claim 12, wherein, prior to singulation of the integrated circuit device from the semiconductor wafer, the integrated circuit device further comprises:

a redistribution layer formed on the first passivation layer.

14. The integrated circuit device of claim 13, wherein, prior to singulation of the integrated circuit device from the semiconductor wafer, the integrated circuit device further comprises:

a second passivation layer formed on the redistribution layer and the first passivation layer.

15. The integrated circuit device of claim 14, wherein, prior to singulation of the integrated circuit device from the semiconductor wafer, the integrated circuit device further comprises:

solder balls applied on the redistribution layer.

16. The integrated circuit device of claim 12, wherein the first passivation layer has a first thickness on the edges of the integrated circuit device.

17. A method for forming a packaged integrated circuit device, the method comprising:

providing a semiconductor wafer having a plurality of integrated circuit devices, each integrated circuit device extending into the semiconductor wafer to a first depth; and prior to singulation of the integrated circuit devices on the semiconductor wafer:

forming a cut between the integrated circuit devices, the cut extending to at least the first depth, but the cut not extending completely through the semiconductor wafer, wherein the cut exposes a plurality of edges of each of the integrated circuit devices; and depositing, on each integrated circuit device, a passivation layer on a top surface and on the edges; and etching the passivation layer to form a trench between integrated circuit devices, the trench extending to at least the first depth, wherein in etching the passivation layer, the passivation layer remains at a first thickness on the edges of the integrated circuit devices.

18. A method for forming a packaged integrated circuit device, the method comprising:

providing a semiconductor wafer having a plurality of integrated circuit devices, each integrated circuit device extending into the semiconductor wafer to a first depth; and prior to singulation of the integrated circuit devices on the semiconductor wafer:

forming a cut between the integrated circuit devices, the cut extending to at least the first depth, but the cut not extending completely through the semiconductor wafer, wherein the cut exposes a plurality of edges of each of the integrated circuit devices; and depositing, on each integrated circuit device, a passivation layer on a top surface and on the edges;

etching the passivation layer to form a trench between integrated circuit devices, the trench extending to at least the first depth;

providing a positive-tone photoresist on a surface of the passivation layer; and exposing the positive-tone photoresist in a region associated with the trench.

19. A method for forming a packaged integrated circuit device, the method comprising:

providing a semiconductor wafer having a plurality of integrated circuit devices, each integrated circuit device extending into the semiconductor wafer to a first depth; and prior to singulation of the integrated circuit devices on the semiconductor wafer:

forming a cut between the integrated circuit devices, the cut extending to at least the first depth, but the cut not extending completely through the semiconductor wafer, wherein the cut exposes a plurality of edges of each of the integrated circuit devices; and depositing, on each integrated circuit device, a passivation layer on a top surface and on the edges;

etching the passivation layer to form a trench between integrated circuit devices, the trench extending to at least the first depth;

providing a negative-tone photoresist on a surface of the passivation layer; and blocking the negative-tone photoresist from being exposed in a region associated with the trench.

* * * * *